(12) United States Patent
Yoo

(10) Patent No.: US 7,659,164 B1
(45) Date of Patent: Feb. 9, 2010

(54) METHOD FOR FABRICATING CAPACITOR OF SEMICONDUCTOR DEVICE

(75) Inventor: Keon Yoo, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/345,622

(22) Filed: Dec. 29, 2008

(30) Foreign Application Priority Data

Sep. 9, 2008 (KR) ...................... 10-2008-0088962

(51) Int. Cl.
*H01L 21/00* (2006.01)
(52) U.S. Cl. ................ 438/256; 438/399; 257/E21.646
(58) Field of Classification Search ......... 438/239–256, 438/386–399; 257/E21.646
See application file for complete search history.

(56) References Cited

U.S. PATENT DOCUMENTS 6,858,891 B2 *  2/2005  Farnworth et al. .......... 257/296
7,081,385 B2 *  7/2006  Farnworth et al. .......... 438/253
7,365,395 B2 *  4/2008  Stumbo et al. ............. 257/347

OTHER PUBLICATIONS

Hochbaum, et al., "Controlled Growth of Si Nanowire Arrays for Device Integration," Nano Letters, vol. 5, No. 3, pp. 457-460 (2005).
Nishio, et al., "Fabrication of Ideally Ordered Anodic Porous Alumina with Large Area by Vacuum Deposition of Al Onto Mold," *J. Vac. Sci. Technol.*. B—Microelectronics and Nanometer Structures, 26(1), pp. L10-L12 (2008).

* cited by examiner

*Primary Examiner*—Richard A. Booth
(74) *Attorney, Agent, or Firm*—Marshall, Gerstein & Borun LLP

(57) ABSTRACT

A method for fabricating a capacitor of a semiconductor device comprises forming a silicon nanowire structure having a large aspect ratio using a porous anodic alumina structure and applying the silicon nanowire structure to a bottom electrode, thereby obtaining a capacitor having secured capacitance.

14 Claims, 6 Drawing Sheets

METHOD FOR FABRICATING CAPACITOR OF SEMICONDUCTOR DEVICE

CROSS-REFERENCE TO RELATED APPLICATION

Priority to Korean patent application number 10-2008-0088962, filed on Sep. 9, 2008, the entire disclosure of which is incorporated by reference, is claimed.

BACKGROUND OF THE INVENTION

The present invention relates to a method for fabricating a capacitor of a semiconductor device, and more specifically, to a method for fabricating a capacitor of a semiconductor device by forming a silicon nanowire structure having a large aspect ratio using a porous anodic alumina structure and applying the silicon nanowire structure to a bottom electrode, thereby obtaining a capacitor having secured capacitance.

Due to rapid distribution of information media such as computers, the development of process equipment and process techniques is required to manufacture a high-integrated semiconductor memory device that operates at high speeds with large capacities.

A memory cell of a DRAM device includes a transistor and a capacitor. The transistor serves as a switch for transmitting information. The capacitor is configured to store data. Generally, the capacitor includes conductive materials to supply current which are arranged in a given space. The conductive materials are insulated by an insulating material having a specific dielectric constant. The capacitance of the capacitor is proportional to the effective area of the capacitor and the dielectric constant of the conductive material used as a dielectric material, and inversely proportional to a space between the two conductive materials.

In order to fabricate a capacitor with secured capacitance, studies to increase the height of the lower storage electrode of the capacitor and the effective area like the surface area of the capacitor are continually being researched. Recently, a cylinder-type capacitor, with an internal area as well as external area, used as a node area has been applied in the manufacturing process of semiconductor devices.

Meanwhile, due to improvement in the integration of the semiconductor memory device and reduction in the effective area of the semiconductor device, it is necessary to develop a capacitor structure suitable for high-integrated memory devices so that the capacitance of the capacitor may be maintained over a given set-standard.

Methods for fabricating a capacitor includes: (1) a method for increasing a lower electrode area vertically while a two-dimensional size is limited by increasing a thickness of a capacitor oxide film by a stack process or an etched depth of a lower silicon substrate by a trench process; (2) a method for decreasing a formation thickness of a dielectric film or using a high dielectric constant (high-K) material, for example, a conductive material having a high dielectric constant; or (3) a method for growing a meta-phase silicon (MPS) at inner sidewalls of a capacitor pattern to form a concavo-convex structure over the surface of the capacitor or increasing the effective area in a capacitor structure using polysilicon as upper and lower electrodes to improve capacitance. The high dielectric constant material used in the method (2) includes a metal having a large atomic weight like hafnium (Hf), zirconium (Zr), tantalum (Ta) or strontium (St) or metal oxides obtained from combinations thereof.

However, as the semiconductor memory device becomes more integrated, when the methods (1) and (3) are performed, the aspect ratio of the lower electrode is increased due to increase of the thickness of the capacitor oxide film, so that it is difficult to perform a patterning process using a photolithography process. As a result, since it is difficult to etch the capacitor oxide film with a uniform type, the number of defective proportion can be high after the patterning process. Also, in the method (2), when the high dielectric constant materials are deposited with several Å thickness (1^–10 m) by an atomic layer deposition (ALD) method, the process difficulty is increased so that it is difficult to deposit the high dielectric material uniformly. As a result, leakage current through the dielectric film is generated, which results in loss of charges stored in the lower electrode and information loss.

BRIEF SUMMARY OF THE INVENTION

Various embodiments of the disclosure are directed at providing a method for fabricating a capacitor of a semiconductor device with secured capacitance over a given set-standard according to improvement of the memory integration. Specifically, after a silicon nanowire structure is vertically grown over a semiconductor substrate using a porous anodic alumina structure, the silicon nanowire structure is used as a lower storage node.

According to an embodiment of the invention, a method for fabricating a capacitor of a semiconductor device comprises: forming a transistor including a gate electrode and a landing plug contact over a substrate; forming a first insulating film including a via-contact connected to the landing plug contact over the transistor; over-growing a silicon layer to top portion of the first insulating film from the landing plug contact through the via-contact; forming a second planarized insulating film over the over-grown silicon layer and the first insulating film; forming a porous anodic alumina structure including a hole over the silicon layer and the second insulating film; forming a metal layer in the bottom portion of the hole of the porous anodic alumina structure; growing a silicon nanowire structure with the porous anodic alumina structure and the metal layer; removing the porous anodic alumina structure and the metal layer; and forming a dielectric film and an upper electrode over the resulting structure including the silicon nanowire structure.

The transistor is not particularly limited and can be suitable selected in accordance with the purpose. The transistor is preferably a cell operation transistor having a planar channel structure, a transistor having a concave channel structure or a transistor having a vertical channel structure.

The silicon layer is grown by epitaxially growing a silicon in the landing plug contact exposed through a via-contact to the top portion of the first insulating film. In the epitaxial growth process, a process time is regulated similar to a general deposition process to adjust the growth thickness. For example, when the silicon layer is over-grown to form an island-type silicon layer over the surface of the first insulating film through the via-contact, a lateral growing degree of the island-type silicon layer is regulated so that an electric short may not occur in a subsequent lower electrode forming process. Preferably, the silicon layer is grown in a chamber, which is filled with a silicon gas atmosphere and equipped with a wafer, at a temperature ranging from 500 to 800° C. A space between the island-type silicon layers grown over the first insulating film can be properly adjusted depending on the width of the landing plug contact. Preferably, the silicon layer is grown until the island-type silicon layers are isolated with a space ranging from 50 to 200% to the whole critical dimension of the landing plug contact. More preferably, the silicon layer is grown until the island-type silicon layers are isolated with a space ranging from 10 to 100 nm.

The second insulating film is not particularly limited and can be suitable selected in accordance with the purpose. The second insulating film is preferably a silicon oxide film, and is planarized by a chemical mechanical planarizing process (CMP).

In the method, the porous anodic alumina structure includes an oxidation aluminum structure. Specifically, the forming-a-porous-anode-alumina-structure includes: forming an aluminum layer over the resulting structure including the second insulating film and the silicon layer; firstly oxidizing the aluminum layer to form an oxidized aluminum layer having a concavo-convex structure; removing a portion of the concavo-convex structure of the oxidized aluminum layer; and secondly oxidizing the oxidized aluminum layer to form a porous anodic alumina structure having a hole.

The firstly oxidizing process is performed by an anode oxidation process. For example, a fine hole is formed when a voltage is applied using a thin aluminum film as an anode and a carbon electrode as a cathode under an atmosphere including a large amount of oxygen and hydrogen at a high temperature with high humidity. When oxygen ions in electrolyte solutions such as oxalic acid, phosphoric acid and sulfuric acid are diffused into the aluminum through the fine hole, the aluminum ions flow out. As a result, an oxidation aluminum concave-convex structure having a given space is formed over the surface of the aluminum layer. The space of the fine hole is determined by the voltage and the electrolyte solutions during the anode oxidation process. The depth of the fine hole is proportional to time for performing the anode oxidation process.

Before the secondly oxidation process, a portion of the oxide (concave-convex) formed over the oxidized aluminum layer is removed by using a mixture solution including sulfuric acid and hydrochloric acid as an etching solution. As a result, a step difference between the concave and the convex is reduced so that the concave-convex structure may be uniformly aligned.

In the secondly oxidation process, the convex of the oxidized aluminum layers aligned with a given space is selectively oxidized to form a porous anodic alumina layer having a hole. The hole of the porous anodic alumina structure has a diameter ranging from 1 to 500 nm which can be applied in a high-integrated DRAM.

After the secondly oxidizing process, the forming-a-porous-anode-alumina-structure further includes performing an isotropic etching process on the porous anodic alumina structure to remove the oxidized aluminum residual that remains in the bottom portion of the hole. The top portion of the island-type silicon layer is exposed through the hole of the porous anodic alumina structure by the removing process.

In the method, the silicon nanowire structure is grown by a vapor-liquid-solid (VLS) change process using a metal as a catalyst. For example, when the wafer is exposed to silicon gas of high temperature after a metal layer used as a catalyst is formed in the bottom portion of the hole of the porous alumina structure, the lowest melting point is created in the bottom portion of the metal layer. As a result, the silicon gas is condensed so that a liquid silicon layer is formed between the silicon substrate and the metal layer. The liquid silicon layer is crystallized, thereby forming a silicon single-crystal nanowire structure in the bottom portion of the metal layer. The metal layer is not particularly limited and can be suitable selected in accordance with the purpose. The metal layer preferably includes one selected from the group consisting of gold, cobalt, nickel and indium. The silicon nanowire structure may be grown only in the silicon layer exposed in the bottom portion of the hole of the porous anodic alumina layer.

After the silicon nanowire structure is grown, the substrate is dipped in a mixture solution including sulfuric acid and hydrofluoric acid (HF) or sulfuric acid and hydrogen peroxide to remove the metal layer and the porous anodic alumina structure.

An upper electrode using a dielectric film and a conductive material is deposited over the resulting structure including the grown silicon nanowire structure, thereby forming a storage electrode of the capacitor. Since the silicon nanowire structure has been electrically isolated, an additional process for isolating the structure is not required.

As mentioned above, it is difficult to form a lower electrode having a large aspect ratio according to reduction of the size of the semiconductor memory device in the prior art. However, in the disclosed method, while the size of the semiconductor memory is reduced, the silicon nanowire having a high aspect ratio can be formed with a small manufacturing cost. As a result, since the area of the lower electrode is increased, a capacitor having secured capacitance is obtained. Moreover, since the disclosed silicon nanowire structure is grown only over the silicon layer connected to the via-contact, the misalignment with the via-contact can be improved. Also, one transistor may be connected to several silicon nanowire structures aligned with a given interval, thereby obtaining a capacitor with increased capacitance.

Furthermore, since the disclosed silicon nanowire structure has been electrically isolated and the upper electrode is commonly used in the arrangement of the storage nodes, an additional process for isolating the silicon nanowire structures electrically is not required after the lower electrode using the silicon nanowire structure is formed. The disclosed method can be applied to all kinds of semiconductor devices each including a capacitor for storing electric information using capacitance of a pair of electrodes with the dielectric film placed in between the electrodes or for having a specific function in a semiconductor circuit. That is, the disclosed method can be applied to semiconductor devices such as a DRAM that requires a conventional capacitor, an embedded memory device and other complementary metal oxide film transistors.

DESCRIPTION OF SPECIFIC EMBODIMENTS

FIGS. 1a to 1f are cross-sectional diagrams illustrating a method for fabricating a capacitor of a semiconductor device according to an embodiment of the present invention.

Figure 1A:
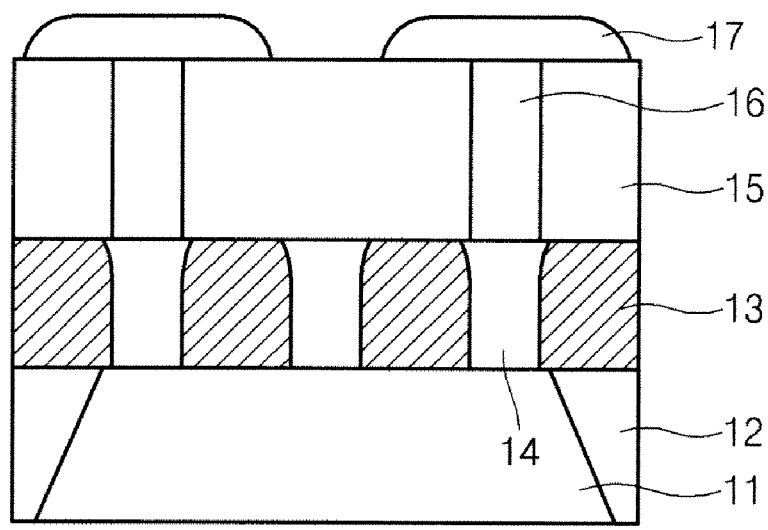
FIGS. 1a to 1f are cross-sectional diagrams illustrating a method for fabricating a capacitor of a semiconductor device according to an embodiment of the present invention.

Referring to FIG. 1a, a transistor including a gate electrode 13 and a landing plug contact 14 is formed over a substrate 11 including an isolation film 12.

A first insulating film 15 is deposited over the resulting structure including the gate electrode 13 and the landing plug contact 14. The first insulating film 15 is etched to form a via-contact 16 that exposes the landing plug contact 14.

A silicon in the landing plug contact exposed by the via-contact 16 is over-grown by an epitaxial process to fill a via-contact and to form a silicon layer 17 grown to the surface of the first insulating film 15. The over-grown silicon layer 17 is formed to have an island-type over the surface of the first insulating film 15. The silicon layer 17 is grown in a chamber, which is filled with a silicon gas atmosphere and equipped with a wafer, at a temperature ranging from 500 to 800° C. so that an electric short does not occur between neighboring lower electrodes. The island-type silicon layer 17 is grown until the silicon layers 17 are isolated with a space ranging from 10 to 100 nm.

Figure 1B:
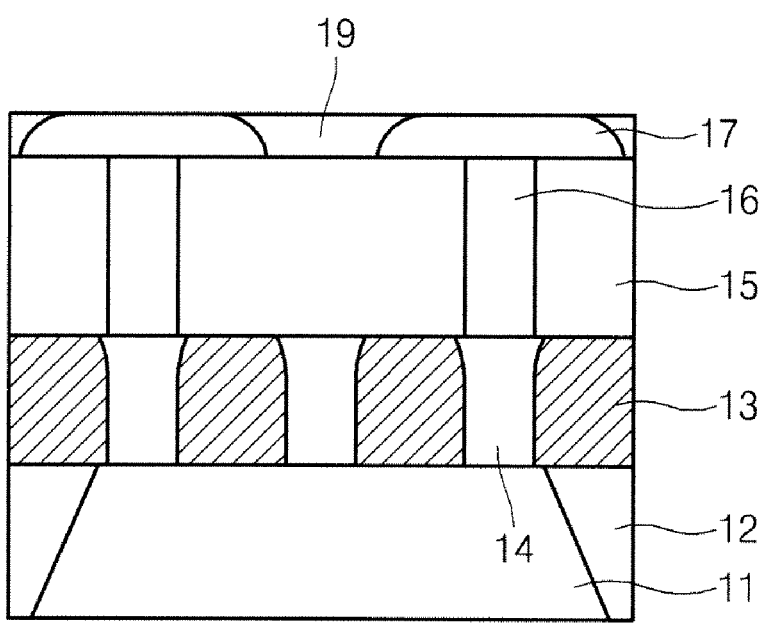

Referring to FIG. 1b, a second insulating film 19 is formed over the resulting structure including the silicon layer 17 formed over the insulating film 15. A chemical mechanical polishing process is performed on the second insulating film 19 to expose the silicon layer 17.

The polishing process is required to grow a hole with a uniform space when a porous anodic alumina layer is grown.

Figure 1C:
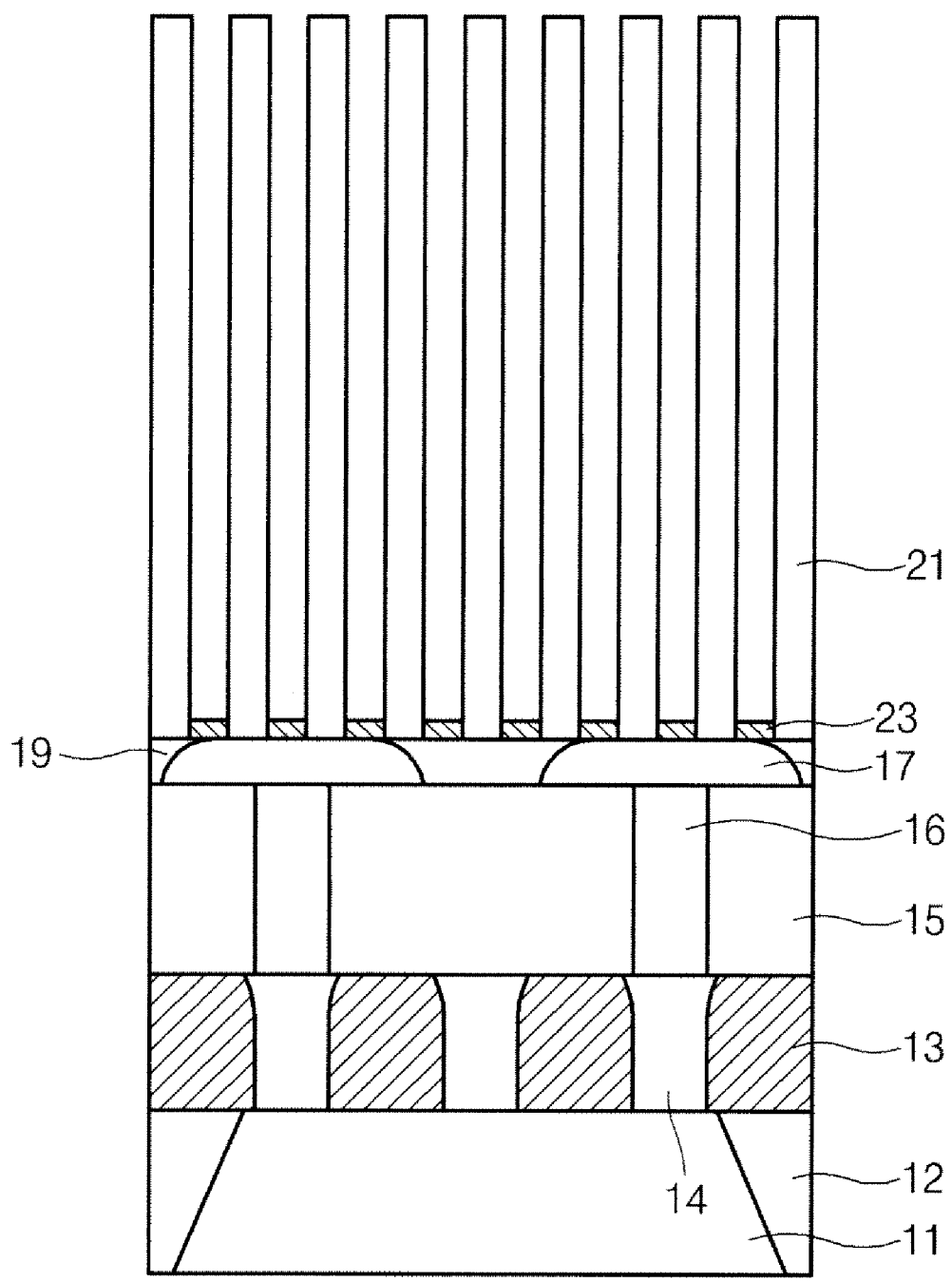

Referring to FIG. 1c, an aluminum layer (not shown) is deposited over the island-type silicon layer 17 and the second insulating film 19. The aluminum layer is firstly oxidized, thereby forming an oxidized aluminum layer (not shown) having a concave-convex structure aligned with a given space.

Specifically, the firstly oxidization process is performed while a voltage is applied using an aluminum film as an anode and a carbon electrode as a cathode under an atmosphere including a large amount of oxygen and hydrogen at a high temperature with high humidity. A fine hole is formed in the aluminum layer by the oxidation process. When oxygen ions in electrolyte solutions such as oxalic acid, phosphoric acid and sulfuric acid are diffused into the aluminum through the fine hole, the aluminum ions flow out. As a result, an oxidation aluminum concave-convex structure having a given space is formed over the aluminum layer [Nishio, K., Yanagishita, T., Hatakeyama, S., Maegawa, H., Masuda, H., Fabrication of ideally ordered anodic porous alumina with large area by vacuum deposition of Al onto mold, Journal of Vacuum Science and Technology B: Microelectronics and Nanometer Structures 26 (1), pp. L10-L12]. The space of the fine hole is determined by the voltage and the electrolyte solutions during the anode oxidation process. The depth of the fine hole is proportional to time for performing the anode oxidation process.

When a portion of the oxide (convex) formed over the oxidized aluminum layer is removed with a mixture solution including sulfuric acid and hydrochloric acid as an etching solution, a step difference of the concave-convex structure is reduced so that the concave-convex structure may be uniformly aligned.

Figure 2:
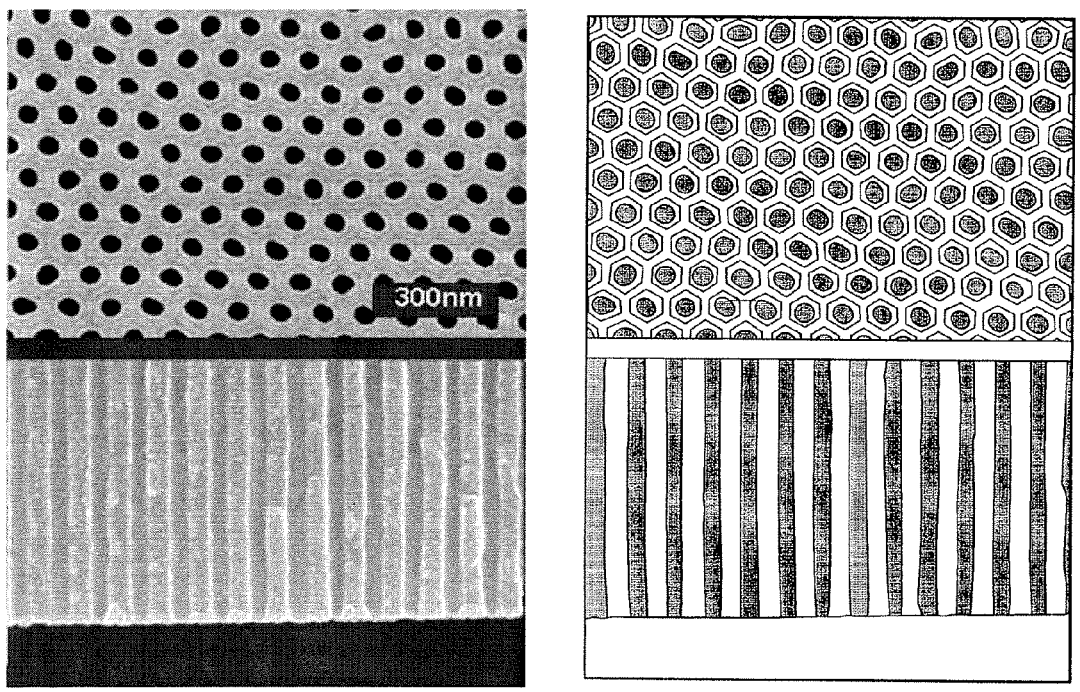
FIG. 2 is an electron microscope photograph that shows a planar and side view of a porous anodic alumina structure obtained from FIG. 1c.

By the secondly oxidation process, the convex layer of the oxidized aluminum layer aligned with a given space is selectively oxidized to form a porous anodic alumina structure 21 (see FIG. 2) [H. Masuda and M. Satch, Jpn. J. Appl. Phys., 35, (1996) L126]. By the process for planarizing the island-type silicon layer 17 and the second insulating film 19 in the previous step, the hole of the porous anodic alumina has a diameter ranging from 1 nm to 500 nm which can be applied to the next generation high-integrated DRAM.

By performing an isotropic etching process on the porous anodic alumina structure 21, the oxidized aluminum residual that remains in the bottom portion of the hole of the porous anodic alumina layer is removed. By this process, the top portion of the island-type silicon layer is exposed through the hole of the porous anodic alumina layer.

As shown in FIG. 1c, a metal layer 23 is deposited over the silicon layer 17 exposed in the bottom portion of the hole of the porous anodic alumina structure 21.

The metal layer includes one selected from the group consisting of gold, cobalt, nickel and indium. Preferably, gold with the lowest melting point of 360° C. is used.

Figure 1D:
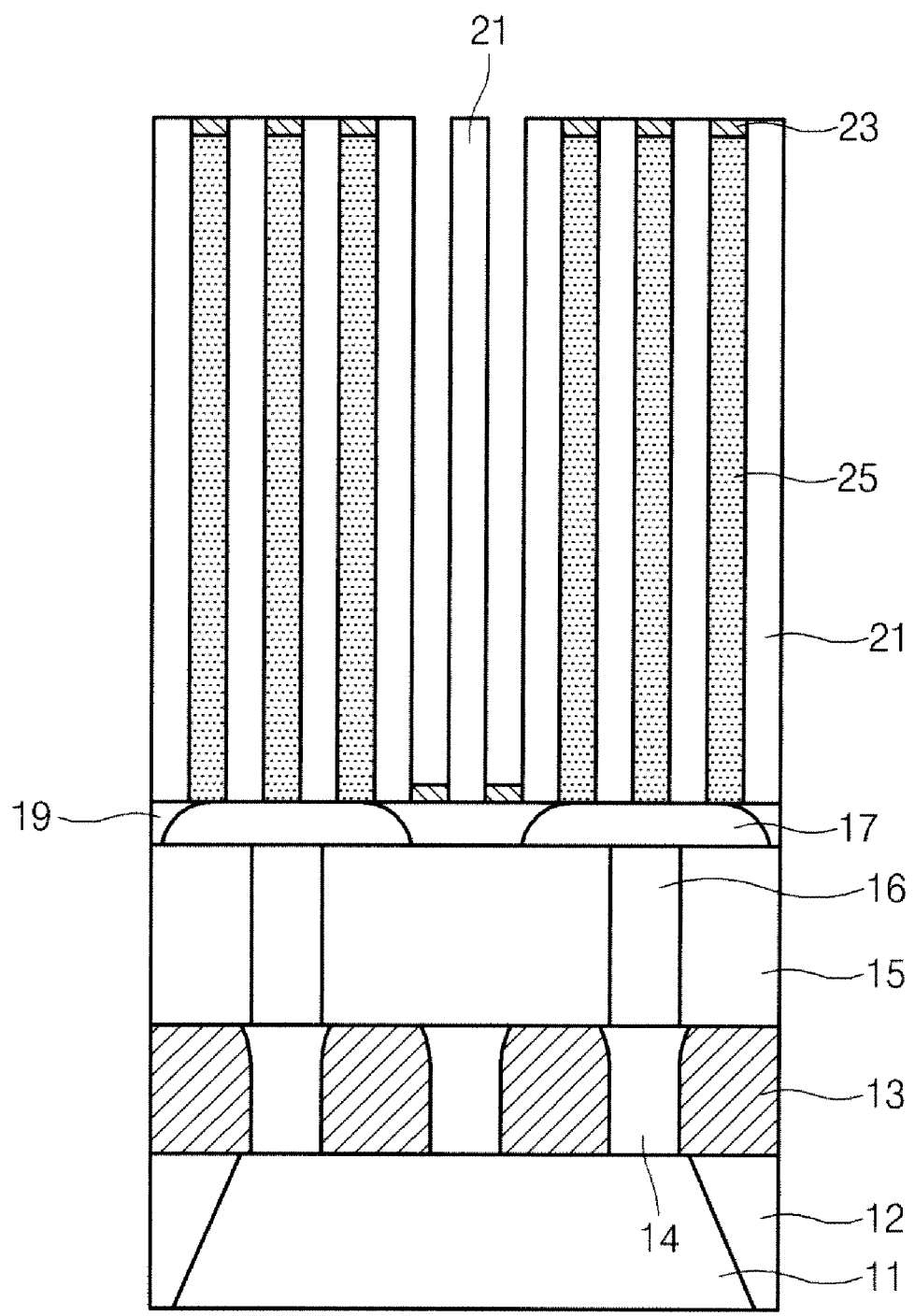

Referring to FIG. 1d, a silicon nanowire structure 25 is grown using the porous anodic alumina structure 21 and the metal layer 23.

Specifically, a substrate that has a template is put in a furnace of high temperature, and heated while silicon gas and a wire source are implanted. Then, a process for exposing the wafer to silicon gas at a higher temperature than the lowest melting point of the metal layer and a process for lowering an atmosphere temperature below the lowest melting point of a metal catalyst is repeatedly performed. As a result, since the lowest melting point is created in the bottom portion of the metal layer, the silicon gas between the silicon substrate and the metal layer is condensed and a liquid silicon layer is formed. The liquid silicon layer is crystallized so that a silicon single crystal nanowire structure is grown in the bottom portion of the metal layer. The silicon nanowire structure can be grown only in the exposed portion of the lower silicon substrate between the porous anodic alumina structures. Therefore, the silicon nanowire structure is selectively grown only in a region to be used as a storage node [Hochbaum, A. I., Fan, R., He, R., Yang, P. controlled Growth of Si Nanowire Arrays for Device Integration, Nano Letters 5 (3), pp. 457-460].

An internal pressure of the furnace is below 760 torr, a temperature ranges from SL 370 to 600° C., and a temperature of the gas and wire source ranges from 370 to 600° C. The heating temperature can be adjusted depending on the length of the silicon nanowire structure. The gas that includes one selected from the group consisting of Ar, $N_2$, He and $H_2$ is implanted with 100 sccm. The wire source includes one selected from the group consisting of $SiH_4$, $SiCl_4$ and $SiH_2Cl_2$. For example, when gold with the lowest melting point of 360° C. is used as the metal catalyst, the atmosphere temperature for growing the silicon nanowire structure is estimated to range from 400 to 500° C.

Figure 1E:
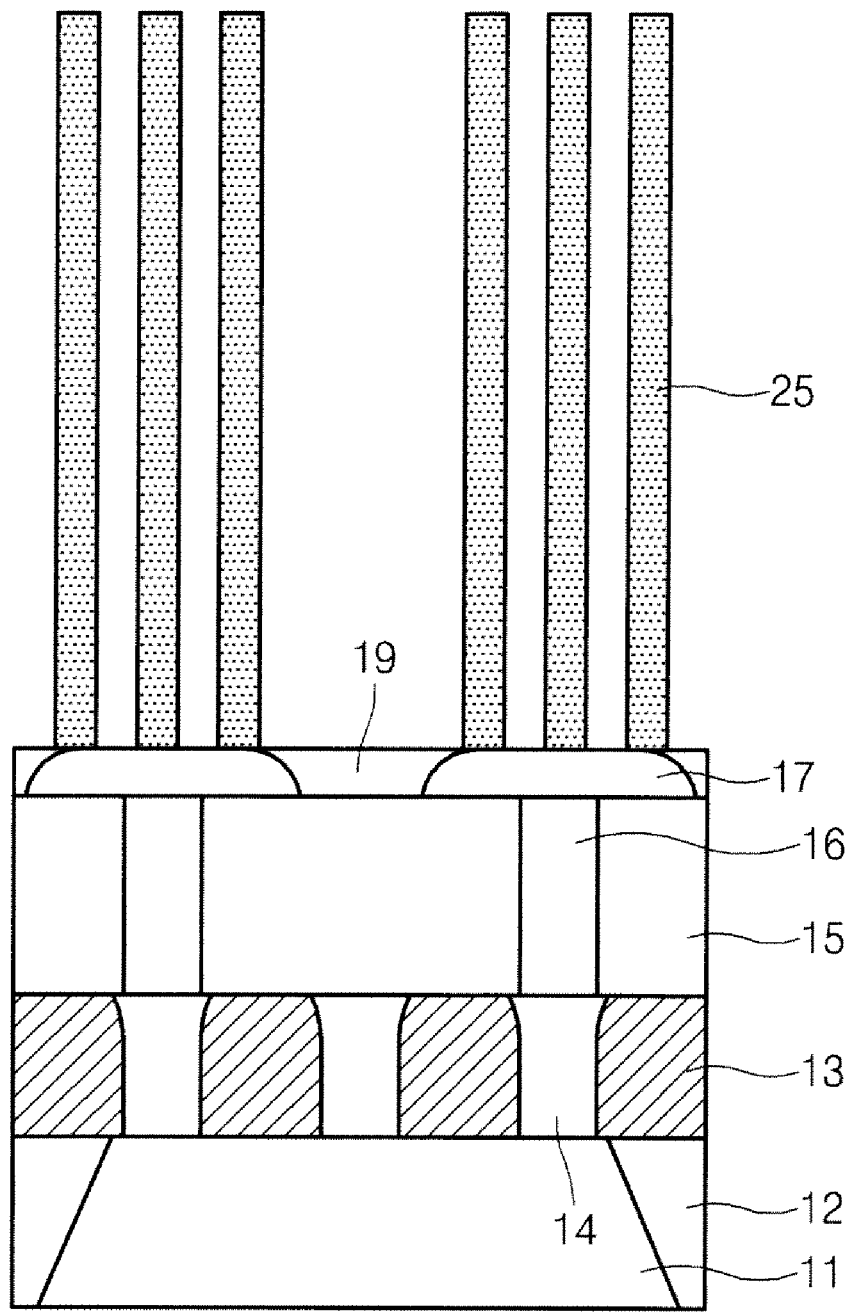

Referring to FIG. 1e, after the silicon nanowire structure 25 is grown, the metal layer 23 and the porous anodic alumina structure 21 except for the silicon nanowire structure are removed.

The removal process is performed by dipping the wafer in a chemical solution including sulfuric acid and hydrofluoric acid or sulfuric acid and hydrogen peroxide.

Figure 1F:
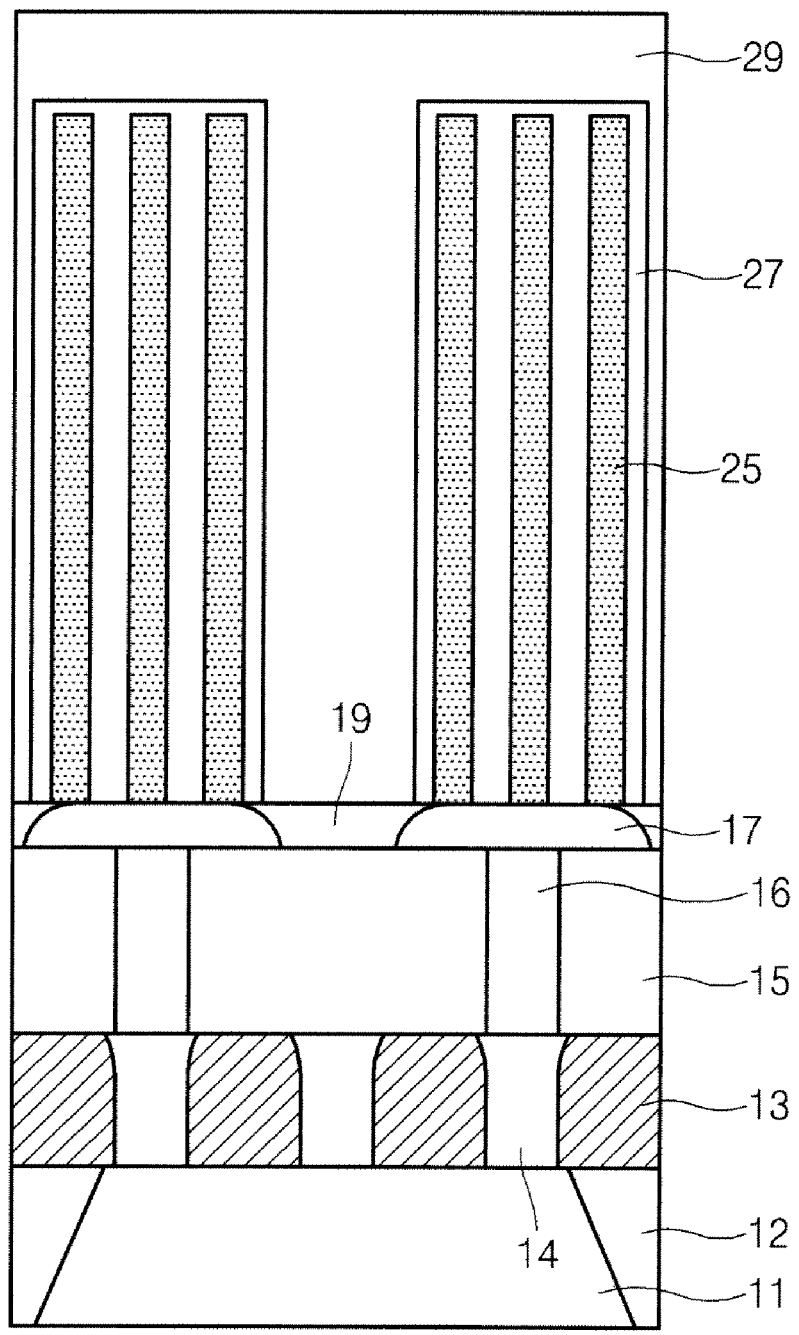

Referring to FIG. 1f, a dielectric film 27 is deposited over the resulting structure including the silicon nanowire structure 25, and a conductive material is deposited over the dielectric film 27 to form an upper electrode 29.

The silicon nanowire structure 25 which is a lower electrode has been electrically isolated, and the upper electrode 29 is commonly used in the arrangement of the storage nodes. As a result, an additional process for electric isolation of the lower electrode is not required after the silicon nanowire structure 25 is formed.

As described above, the disclosed method can form a lower electrode in a stable manner having a high aspect ratio with small process steps and manufacturing cost, thereby obtaining a capacitor having secured capacitance.

The above embodiments of the disclosure are illustrative and not limitative. Various alternatives and equivalents are possible. The invention is not limited by the type of deposition, etching polishing, and patterning steps describe herein. Nor is the invention limited to any specific type of semiconductor device. For example, the disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a capacitor of a semiconductor device, the method comprising:
   forming a transistor including a gate electrode and a landing plug contact over a substrate;
   forming a first insulating film including a via-contact connected to the landing plug contact over the transistor;
   growing a silicon layer to top portion of the first insulating film from the landing plug contact through the via-contact;
   forming a second planarized insulating film over the grown silicon layer and the first insulating film;
   forming a porous anodic alumina structure including a hole over the silicon layer and the second insulating film;
   forming a metal layer in the bottom portion of the hole of the porous anodic alumina structure;
   growing a silicon nanowire structure with the porous anodic alumina structure and the metal layer;
   removing the porous anodic alumina structure and the metal layer; and
   forming a dielectric film and an upper electrode over the resulting structure including the silicon nanowire structure.

2. The method according to claim 1, wherein the transistor includes a cell operation transistor having a planar channel structure, a transistor having a concave channel structure or a transistor having a vertical channel structure.

3. The method according to claim 1, wherein the silicon-layer is grown by epitaxial growth process.

4. The method according to claim 1, wherein the silicon layer is grown as an island-type over the first insulating film.

5. The method according to claim 1, wherein the silicon layer is grown in a chamber, which is filled with a silicon gas atmosphere and equipped with a wafer, at a temperature ranging from 500 to 800° C.

6. The method according to claim 1, wherein the forming-a-porous-anode-alumina-structure includes:
   forming an aluminum layer over the resulting structure including the second insulating film and the silicon layer;
   firstly oxidizing the aluminum layer to form an oxidized aluminum layer having a concavo-convex structure;
   removing a portion of the concavo-convex structure of the oxidized aluminum layer; and
   secondly oxidizing the oxidized aluminum layer to form a porous anodic alumina structure having a hole.

7. The method according to claim 6, wherein the firstly oxidizing process is performed by an anode oxidation process.

8. The method according to claim 6, wherein the concave-convex structure is removed with a mixture solution including sulfuric acid and hydrochloric acid.

9. The method according to claim 6, wherein the hole of the porous anodic alumina structure has a diameter ranging from 1 nm to 500 nm.

10. The method according to claim 6, after the secondly oxidizing process, further including performing an isotropic etching process on the porous anodic alumina structure to remove the oxidized aluminum residual that remains in the bottom portion of the hole.

11. The method according to claim 1, wherein the metal layer includes one selected from the group consisting of gold, cobalt, nickel and indium.

12. The method according to claim 1, wherein the silicon nano-wire is grown by a vapor-liquid-solid change process.

13. The method according to claim 1, wherein the silicon nanowire structure is grown only in the silicon layer region exposed by the hole of the porous anodic alumina structure.

14. The method according to claim 1, wherein the porous anode alumina structure and the metal layer are removed by dipping the substrate in a mixture solution including sulfuric acid and hydrofluoric acid or sulfuric acid and hydrogen peroxide.

* * * * *